United States Patent
Toyoshima

(10) Patent No.: US 8,180,589 B2
(45) Date of Patent: May 15, 2012

(54) SYSTEM FOR MANAGING RECIPES FOR OPERATING A MEASUREMENT DEVICE

(75) Inventor: Yuko Toyoshima, Hokota (JP)

(73) Assignee: Hitachi High-Technologies Corporation, Tokyo (JP)

( * ) Notice: Subject to any disclaimer, the term of this patent is extended or adjusted under 35 U.S.C. 154(b) by 581 days.

(21) Appl. No.: 12/235,745

(22) Filed: Sep. 23, 2008

(65) Prior Publication Data

US 2009/0099805 A1   Apr. 16, 2009

(30) Foreign Application Priority Data

Sep. 28, 2007   (JP) ................................. 2007-252979

(51) Int. Cl.
  *G01R 31/26*   (2006.01)
  *G06F 17/40*   (2006.01)
(52) U.S. Cl. ........... 702/123; 702/127; 702/187; 438/14
(58) Field of Classification Search ................... 702/123, 702/127, 187
See application file for complete search history.

(56) References Cited

U.S. PATENT DOCUMENTS

| | | | | |
|---|---|---|---|---|
| 6,000,830 A | * | 12/1999 | Asano et al. | 700/121 |
| 6,446,022 B1 | * | 9/2002 | Coss et al. | 702/121 |
| 6,984,198 B2 | * | 1/2006 | Krishnamurthy et al. | 438/14 |
| 2002/0046290 A1 | * | 4/2002 | Andersson et al. | 709/237 |
| 2006/0026672 A1 | * | 2/2006 | Braun | 726/9 |
| 2007/0112456 A1 | * | 5/2007 | Sanka et al. | 700/197 |

FOREIGN PATENT DOCUMENTS

JP   2006-060157 A   3/2006

OTHER PUBLICATIONS

Translation of JP 2006-060157, Mar. 2, 2006.*

* cited by examiner

*Primary Examiner* — Hal Wachsman
(74) *Attorney, Agent, or Firm* — Miles & Stockbridge P.C.

(57) ABSTRACT

A semiconductor wafer inspection device which identifies an operator when an operation is performed and checks if the requested operation is permitted is provided. In a device that has already performed an operator authentication, the operator identification is further carried out when a particular operation is requested. If the operation requested is a permitted one, it is executed even if requested by an operator different from the one previously authenticated. The history of operations and the change history of in-device data are recorded and displayed. The operator authentication is performed only when necessary.

10 Claims, 6 Drawing Sheets

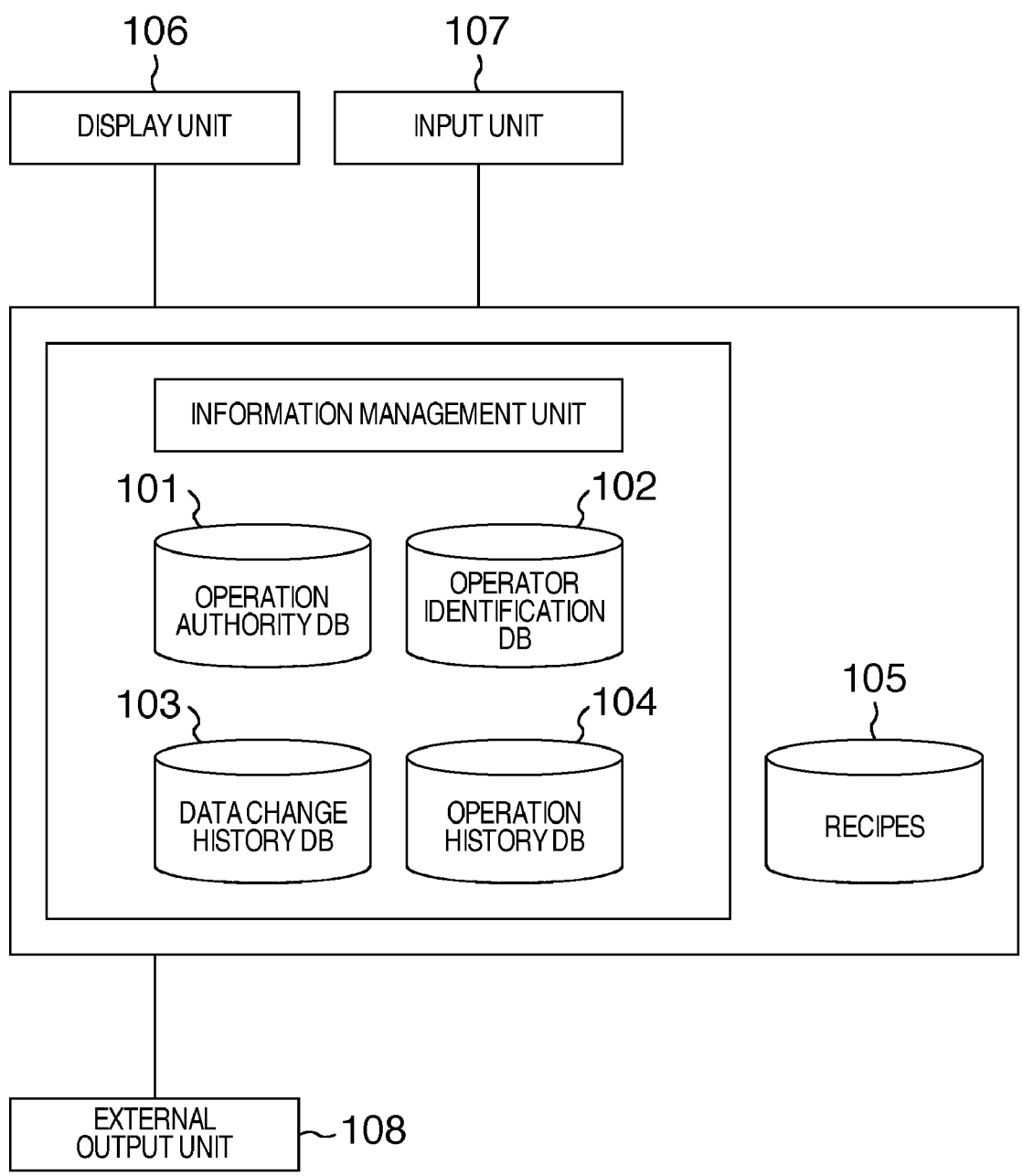

FIG.2A

| OPERATION AUTHORITY \ OPERATION | OPERATION 1 | OPERATION 2 | OPERATION 3 | OPERATION 4 | OPERATION 5 | OPERATION 6 | OPERATION 7 | OPERATION 8 | OPERATION 9 | OPERATION 10 |
|---|---|---|---|---|---|---|---|---|---|---|
| AUTHORITY 1 | VALID | VALID | VALID | VALID | VALID | VALID | VALID | VALID | VALID | VALID |
| AUTHORITY 2 | VALID | VALID | VALID | VALID | VALID | VALID | VALID | VALID | NOT VALID | NOT VALID |
| AUTHORITY 3 | VALID | VALID | VALID | VALID | NOT VALID | NOT VALID | VALID | VALID | NOT VALID | NOT VALID |
| AUTHORITY 4 | VALID | VALID | NOT VALID | VALID | NOT VALID | NOT VALID | NOT VALID | NOT VALID | NOT VALID | NOT VALID |
| ⋮ | | | | | | | | | | |

FIG.2B

| OPERATION AUTHORITY | OPERATOR ID |
|---|---|
| AUTHORITY 1 | AAA, AAa |
| AUTHORITY 2 | BBB, BBb, BbB |
| AUTHORITY 3 | CCC, CCc, CcC, cCC, Ccc |
| AUTHORITY 4 | DDD, DDd, DdD, dDD, Ddd, dDd, ddD, ddd |

FIG.3

| | OPERATION 1 | OPERATION 2 | OPERATION 3 | OPERATION 4 | OPERATION 5 | OPERATION 6 | OPERATION 7 | OPERATION 8 | OPERATION 9 | OPERATION 10 |
|---|---|---|---|---|---|---|---|---|---|---|
| OPERATOR IDENTIFICATION REQUIREMENT | REQUIRED | REQUIRED | REQUIRED | NOT REQUIRED | NOT REQUIRED | REQUIRED | NOT REQUIRED | REQUIRED | NOT REQUIRED | NOT REQUIRED |

FIG.6

| HISTORY \ OPERATION | HISTORY 1 | | | HISTORY 2 | | | --- |
| --- | --- | --- | --- | --- | --- | --- | --- |
| | DATE/TIME OF OPERATION | OPERATOR NAME | OPERATION RESULT | DATE/TIME OF CHANGE | PERSON WHO MADE CHANGES | OPERATION RESULT | --- |
| OPERATION 1 | 2007-01-15T13:26:22.704 | AAA | ALLOWED | 2007-01-05T13:26:22.704 | BbB | ALLOWED | --- |
| OPERATION 2 | 2007-02-22T04:31:59.576 | ccc | REJECTED | 2007-01-05T13:26:22.704 | bbb | SUCCESSFUL | --- |
| OPERATION 3 | 2007-01-15T13:26:22.704 | Aaa | ALLOWED | – | – | – | --- |
| OPERATION 4 | 2007-01-05T13:26:22.704 | BBB | ALLOWED | 2007-01-05T13:26:22.704 | CCC | ALLOWED | --- |

| HISTORY \ PARAMETER NAME | HISTORY 1 | | | HISTORY 2 | | | --- |
| --- | --- | --- | --- | --- | --- | --- | --- |
| | DATE/TIME OF CHANGE | PERSON WHO MADE CHANGES | DATA BEFORE CHANGE | DATE/TIME OF CHANGE | PERSON WHO MADE CHANGES | DATA BEFORE CHANGE | --- |
| A-1 | 2007-01-15T13:26:22.704 | Aaa | 3000 | 2007-01-05T13:26:22.704 | Aaa | 2000 | --- |
| A-2 | 2007-02-22T04:31:59.576 | BBB | 6.0 | 2007-01-05T13:26:22.704 | Aaa | 5.0 | --- |
| A-3 | 2007-01-15T13:26:22.704 | Aaa | 1000 | 2007-01-05T13:26:22.704 | Aaa | 800 | --- |
| A-4 | 2007-01-05T13:26:22.704 | Aaa | 0 | – | – | – | --- |

⋮

SYSTEM FOR MANAGING RECIPES FOR OPERATING A MEASUREMENT DEVICE

CROSS-REFERENCE TO RELATED APPLICATION

This application claims the priority benefit of Japanese Patent Application No. JP 2007-252979 filed on Sep. 28, 2007, the entire disclosure of which is hereby incorporated by reference as if set forth fully herein.

BACKGROUND OF THE INVENTION

The present invention relates to a measurement system and more particularly to a measurement system that activates a measurement device based on a recipe.

Semiconductor wafer inspection devices, such as CD-SEMs (Critical Dimension-Scanning Electron Microscopes), inspect semiconductor wafers according to a recipe. The recipe describes an inspection procedure and inspection conditions and its recipe parameters vary according to a kind of wafer, a lot and a process.

The recipe, if not set with correct recipe parameters conforming to a wafer to be inspected, won't work normally and therefore needs to be managed so that inspections can be performed with right recipes at all times.

For this purpose, it is general practice to allow only those users with a predetermined authority to prepare and edit recipes, the users being operators engaged in the operation of a semiconductor wafer inspection device in a semiconductor manufacturing line.

Normally, an authority for operation including generation and editing of recipes is given as follows.

An operator of the device is identified and authenticated before he or she starts operating the device and, from that moment on, all operations performed on the device are recognized as having been performed by that operator. Therefore, the authority to use the device and parameter settings are those of the operator authenticated at that time.

When another operator uses the device, he is required to take the same identity and authentication procedure. In practice, however, this procedure is not carried out because it is troublesome (complicated). Thus a problem arises that this operator happens to be able to operate the device under the identification and authority of the previously authenticated operator.

To deal with this problem, a method has been disclosed in JP-A-2006-60157 which allows only a particular operation for operators without requiring them to enter their identifier.

However, the above patent has a problem that, when the device is in the process of wafer inspection, it is not possible to switch the authority and setting to those of another operator for device operation.

Consider a case, for example, in which after an authenticated operator A has started a wafer inspection based on a recipe, another operator B, while the first operator A is away, prepares a recipe to be used next. In this case the following problem arises.

The operator B checks the content of the recipe and must edit problems as they arise. Since the device is in the process of wafer inspection, outputting various data associated with the authority and settings of the operator A and displaying the operation state, it is not possible to switch from operator A to operator B while keeping the wafer inspection under way.

In the current situation, once a user authentication is carried out, anybody can edit device data such as recipes, making it impossible to manage the recipes properly. If on the other hand the user authentication is carried out strictly, the user cannot be changed while the recipe is being executed (during the wafer inspection) and therefore one must wait for the completion of the current wafer inspection before the user can be switched.

SUMMARY OF THE INVENTION

In light of the current situation of the wafer inspection described above, it is an object of this invention to provide a method of enhancing security of device data by allowing only a particular operator to edit device data such as recipes without degrading a current operability even during the execution of a recipe (during a wafer inspection).

To achieve the above objective, the present invention, while keeping an authority and various settings of a previous operator, identifies a current operator as he executes an operation or just when so required and allows only an operation conforming to that authority.

Means for authenticating or certifying an operator may include a password, IC tag, card key and biometric authentication (fingerprint, finger vein, iris, voice print and face).

This invention also logs identifies of operators and records and outputs updated history of in-device data that was changed by operators' operations.

This invention performs an operator authentication process only when so required and thereby prevents illicit access to information in the device, strengthening security without deteriorating a current operability.

Other objects, features and advantages of the invention will become apparent from the following description of the embodiments of the invention taken in conjunction with the accompanying drawings.

BRIEF DESCRIPTION OF THE DRAWINGS

FIG. 1 is an outline configuration of this invention.

FIG. 2A shows operations allowed for each operator.

FIG. 2B shows operations allowed for each operator.

FIG. 3 shows operations requiring an operator identity.

FIG. 6 shows a history of operations according to this invention.

FIG. 7 shows a history of changes by recipe parameters.

DESCRIPTION OF THE INVENTION

Now, embodiments of this invention will be described by referring to the accompanying drawings.

FIG. 1 shows one example configuration of a semiconductor wafer inspection device according to this invention.

[Embodiment 1]

FIGS. 2A and 2B show operations allowed to be performed by operators. As shown in FIG. 2A, combinations of operation permissions/non-permissions are predefined as operation authorities. And operators are assigned appropriate operation authorities thus defined, as shown in FIG. 2B, making it possible to set permission or non-permission of individual operations for each operator.

The settings made are stored in an operation authority database 101.

FIG. 3 shows a list of operations requiring an operator identification. Requirement/non-requirement of the operator identification may be set for each operation. The settings made are stored in an operator identification database 102.

Figure 4:
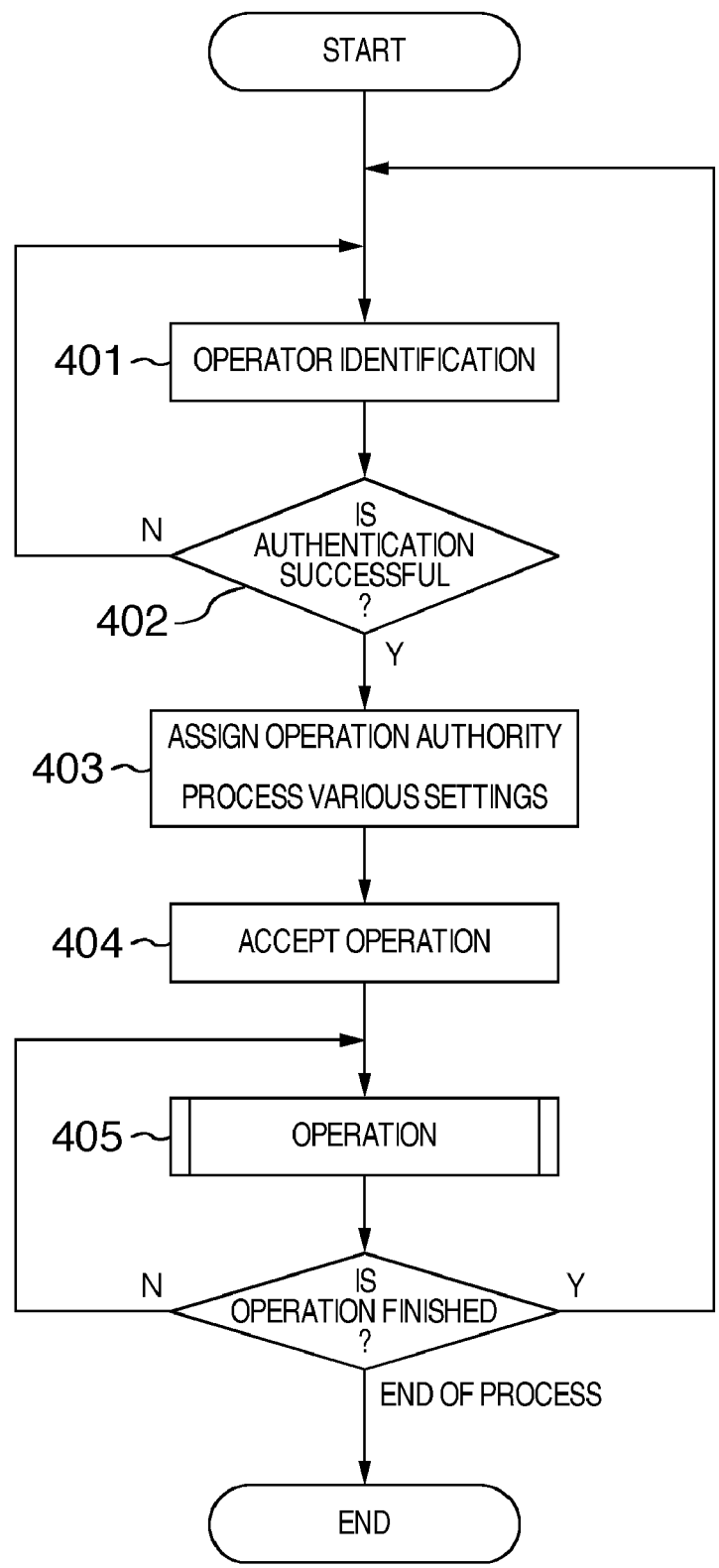
FIG. 4 is a flow diagram showing an operator identification and an operation performed in a conventional device.

In FIG. 4 an operator AAA initiates an authentication process in a device in an operator authentication standby state. Upon receiving an input of the operator identification (401), the device performs an authentication on the operator (402). If the authentication is successful, the device gives the operator an operation authority and performs various settings (403). As a result, operations of authority 1 that is shown assigned to the operator AAA in FIG. 2B become available for the operator to execute (404).

The operator who has completed the authentication procedure, as described above, in the device standing by for the operator authentication can now set either "valid" or "invalid" for the operator identification requirement check to be performed in the operations that follow. This makes it possible to prevent the device from making an authentication request when an authorized operator performs an operation.

The operator AAA sets "invalid" for the operator identification requirement check and, in an operation shown in (405), activates a recipe to get the device to start the wafer inspection according to the recipe, after which the operator leaves the device.

Then, with the operator identification requirement check switched to "valid", an operator BBB prepares the next recipe in the device (405).

Figure 5:
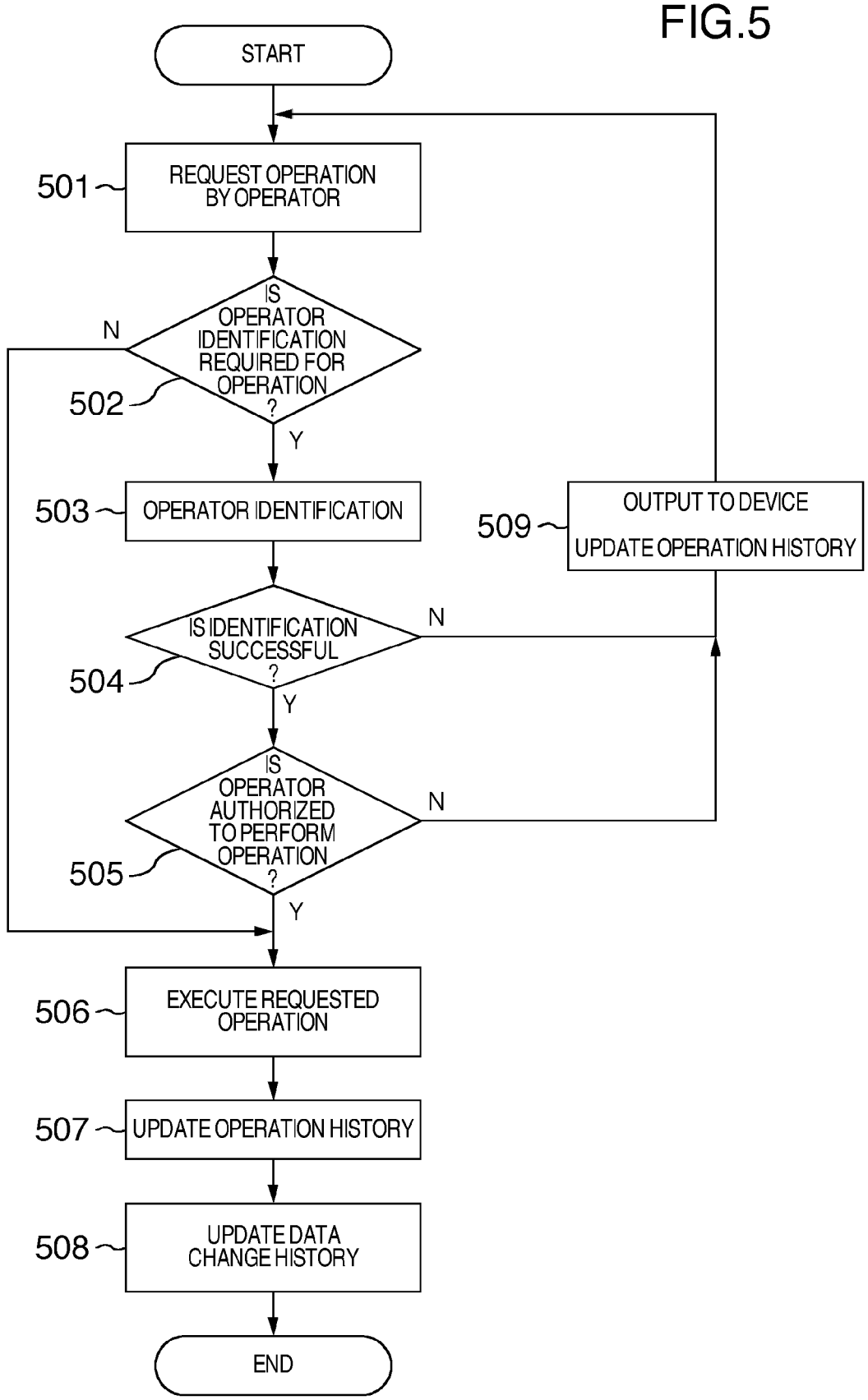
FIG. 5 is a flow diagram showing an operator identification and an operation according to the present invention.

This process is shown in a flow of FIG. 5.

The operator BBB in the device makes a request for displaying the content of the recipe to check inspection conditions (501). This operation does not require the operator identification as shown in FIG. 3 (operation 4) (502). So, the device executes the operation requested by the operator BBB without performing the operator identification (506). The information about the operation executed at this time is stored in the operation history database 104 (507). Information on data that was changed is accumulated in a data change history database 103 (508).

When, after completing the editing of the recipe, the operator BBB performs a store operation (501), the device decides that the operation requires the operator identification according FIG. 3 (operation 6) (502) and then identifies the operator who had done that operation (503). If the operator identification is successful (504), the operator BBB who have done the operation is assigned an authority 2 according to FIG. 2B. Since the operator BBB is authorized to execute the operation 6 according to FIG. 2A (505), the device performs the requested operation (506). Information on the operation performed is accumulated in an operation history database 104 (507). Information on data that was changed is accumulated in the data change history database 103 (508).

If the operator identification fails (504), the processing outputs this fact to the device and stores the operation information in the operation history database 104 without performing the requested operation (509).

When an operator CCC performs a similar operation, he requests the device to display the recipe to confirm the inspection conditions (501). This operation requires no operator identification according to FIG. 3 (operation 4) (502), so that the device executes the operation requested by the operator CCC without performing the operator identification (506). Information on the operation performed at this time is accumulated in the operation history database 104 (507). Further, information of data that was changed is stored in the data change history database 103 (508).

When, after finishing the editing of the recipe, the operator CCC performs a store operation (501), the device decides that the operation requires the operator identification according to FIG. 3 (operation 6) (502) and identifies the operator who have done that operation (503). If the operator identification is successful (504), the identified operator CCC is assigned an authority 3 according to FIG. 2B. Since the operator CCC is found not authorized to perform the operation 6 according to FIG. 2A (505), the processing outputs this fact to the device and stores the operation information in the operation history database 104 without executing the requested operation (509).

Next, the device can output the operation history to a display unit 106 of the device and to an external output unit 108 (see FIG. 1). The operation history accumulates operator IDs who requested individual operations, results of operations requested and information on dates and times that the operation requests were accepted or rejected. An example of operation history output to the display unit 106 of the device is shown in FIG. 6.

In addition to individual history data files, the device can accumulate data change history, including changed date and time, persons who made changes and what were changed (e.g., values before change) for various data such as recipes, and output them to the display unit 106 and the external output unit 108 (see FIG. 1). An example of output to the display unit 106 is shown in FIG. 7. As another example, the data change history can be displayed by pointing a desired parameter on a data setting screen of the device with a mouse or keyboard (e.g., by clicking right mouse and selecting "history" in a menu) (see FIG. 8).

Figure 8:
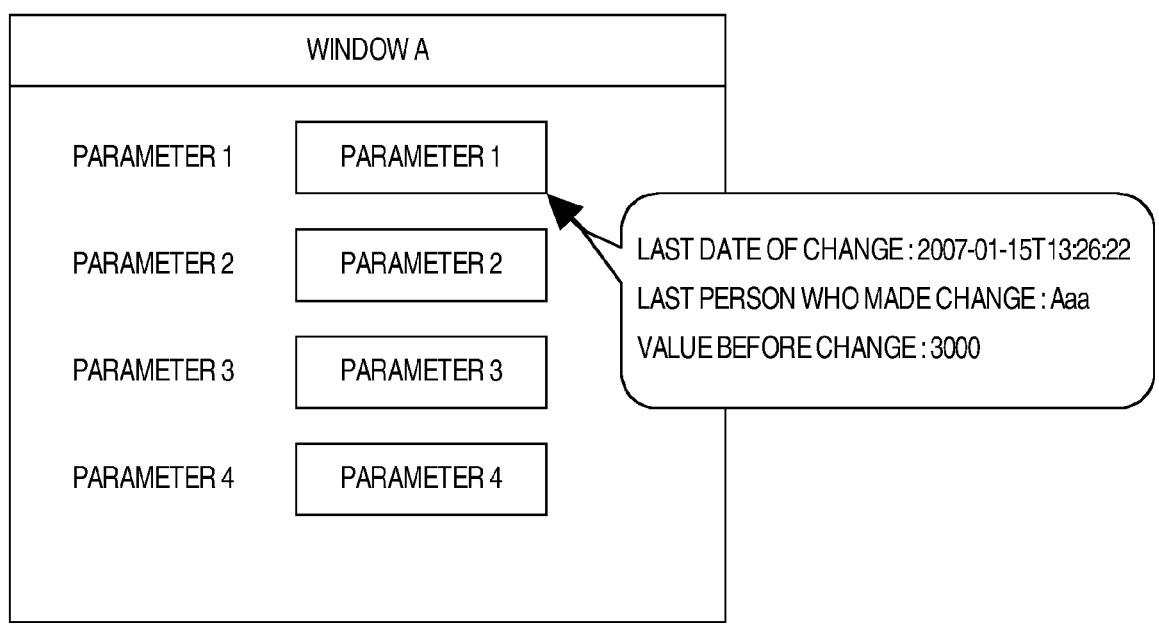
FIG. 8 shows an example display of a change history by recipe parameters.

With this invention, when the recipe in the device no longer operates normally, displaying the change history for each recipe parameter as shown in FIG. 7 and FIG. 8 can facilitate identifying a cause of trouble, thus reducing a period of time during which the device is shut down (down time).

Further, by updating the operation history even when illegal updates of in-device information are rejected in FIG. 5 (509) so as to make the rejected operator identifiable, it can be made easy to locate a factor under which the operator has tried to change the in-device data. This in turn allows the problem to be fed back to the process more quickly, improving the quality of the product.

The present invention can be applied to semiconductor inspection devices.

It should be further understood by those skilled in the art that although the foregoing description has been made of embodiments of the invention, the invention is not limited thereto and various changes and modifications may be made without departing from the spirit of the invention and the scope of the appended claims.

The invention claimed is:

1. A system for managing recipes for operating a measurement device, the system comprising:
    a storing unit which stores information indicating whether an operator identification is required for each operation using recipes performed by an operator;
    an identifying unit which identifies an operator when an operation by said operator is accepted by the system, if said information stored in the storing unit indicates that the operation requires operator identification;
    a deciding unit which decides whether said operation is allowed for said operator;
    a rejecting unit configured to reject an operation that is not allowed for the identified operator;

a recording unit which records an operation performed by the operator regardless of whether it is successful or not, and which records a change history of data includingg the recipes stored in the measurement device that has been changed by the operator's operation; and an outputting unit configured to output the change history.

2. The system according to claim 1, wherein a selection is made between performing and not performing an operator identification requirement check to be carried out when the operation is accepted.

3. The system according to claim 2, wherein the operator identification requirement is registered in advance for each operation.

4. The system according to claim 3, wherein a permission or non-permission of each operation is registered for each operator.

5. The system according to claim 2, wherein combinations of executable operations are registered in advance as a plurality of operation authority patterns.

6. The system according to claim 5, wherein said plurality of operation authority patterns are registered in advance for each operator.

7. The system according to claim 1, wherein a record of operations performed by the operators is output to a screen of the measurement device and is also output to another device which is external to the measurement device.

8. The system according to claim 1, wherein the change history of the in-device data is output to a screen of the measurement device and is also output to another device which is external to the measurement device.

9. The system according to claim 8, further including:

pointing means for selecting a desired point on the screen of the measurement device, wherein said pointing means causes information on the change history about the data to appear on the screen upon operator selection of a point on the screen that is displaying changed data with the pointing means.

10. The system according to claim 9, wherein each operator who made one or more changes, and dates and times of the changes, are displayed on the screen of the measurement device for each item of displayed in-device data.

\* \* \* \* \*